US012685054B2

(12) United States Patent
Tomura et al.

(10) Patent No.: US 12,685,054 B2
(45) Date of Patent: Jul. 14, 2026

(54) PLASMA PROCESSING METHOD AND PLASMA PROCESSING SYSTEM

(71) Applicant: Tokyo Electron Limited, Tokyo (JP)

(72) Inventors: Maju Tomura, Kurokawa-gun (JP);
Kae Takahashi, Kurokawa-gun (JP);
Yoshihide Kihara, Kurokawa-gun (JP)

(73) Assignee: Tokyo Electron Limited, Tokyo (JP)

( * ) Notice: Subject to any disclaimer, the term of this patent is extended or adjusted under 35 U.S.C. 154(b) by 247 days.

(21) Appl. No.: 18/074,071

(22) Filed: Dec. 2, 2022

(65) Prior Publication Data

US 2023/0178343 A1 Jun. 8, 2023

(30) Foreign Application Priority Data

Dec. 3, 2021 (JP) ................................. 2021-197224

(51) Int. Cl.

| | |
|---|---|
| *H10P 50/26* | (2026.01) |
| *C09K 13/00* | (2006.01) |
| *H01J 37/32* | (2006.01) |
| *H10P 50/00* | (2026.01) |
| *H10P 50/24* | (2026.01) |
| *H10P 50/28* | (2026.01) |

(52) U.S. Cl.
CPC ............ *H10P 50/268* (2026.01); *C09K 13/00* (2013.01); *H01J 37/32449* (2013.01); *H01J 37/32715* (2013.01); *H10P 50/242* (2026.01); *H10P 50/267* (2026.01); *H10P 50/283* (2026.01); *H10P 50/71* (2026.01); *H10P 50/73* (2026.01); *H01J 2237/334* (2013.01)

(58) Field of Classification Search
None
See application file for complete search history.

(56) References Cited

U.S. PATENT DOCUMENTS

| | | | |
|---|---|---|---|
| 11,342,194 B2* | 5/2022 | Suda ................. | H01L 21/32139 |
| 2016/0042919 A1 | 2/2016 | Ishita et al. | |
| 2019/0393047 A1 | 12/2019 | Dole et al. | |
| 2021/0159089 A1* | 5/2021 | Suda ................. | H01L 21/32137 |
| 2022/0093367 A1* | 3/2022 | Tanaka .............. | H01J 37/32449 |
| 2025/0014868 A1* | 1/2025 | Yeom ................ | H01J 37/32715 |

FOREIGN PATENT DOCUMENTS

| | | |
|---|---|---|
| JP | 2016-039310 A | 3/2016 |
| JP | 2021-174985 A | 3/2021 |
| KR | 10-2021-0134224 A | 11/2021 |
| TW | 201921488 A | 6/2019 |
| TW | 202125624 A | 7/2021 |

\* cited by examiner

*Primary Examiner* — Jiong-Ping Lu
(74) *Attorney, Agent, or Firm* — PROCOPIO, CORY, HARGREAVES & SAVITCH LLP

(57) ABSTRACT

A plasma processing method performed in a plasma processing apparatus having a chamber is provided. This method comprises: (a) providing a substrate to a substrate support in the chamber, the substrate having a silicon-containing film and a mask film over the silicon-containing film; (b) supplying a processing gas to the chamber, the processing gas including a tungsten-containing gas and a hydrogen fluoride gas, the flow rate of the hydrogen fluoride gas being higher than the flow rate of the tungsten-containing gas; and (c) forming a plasma from the processing gas to etch the silicon-containing film.

17 Claims, 7 Drawing Sheets

PLASMA PROCESSING METHOD AND PLASMA PROCESSING SYSTEM

CROSS-REFERENCE TO RELATED APPLICATIONS

The present application claims priority under 35 U.S.C. § 119 to Japanese Patent Application No. 2021-197224 filed on Dec. 3, 2021, the entire contents of which are incorporated herein by reference.

BACKGROUND

1. Field

Exemplary embodiments of the present disclosure relate to a plasma processing method and a plasma processing system.

2. Related Art

JP 2016-039310 A discloses a method for etching a multilayer film obtained by alternately stacking a silicon oxide film and a silicon nitride film.

SUMMARY

A plasma processing method performed in a plasma processing apparatus having a chamber is provided in an exemplary embodiment of the present disclosure. This method comprises: (a) providing a substrate to a substrate support in the chamber, the substrate having a silicon-containing film and a mask film over the silicon-containing film; (b) supplying a processing gas to the chamber, the processing gas including a tungsten-containing gas and a hydrogen fluoride gas, the flow rate of the hydrogen fluoride gas being higher than the flow rate of the tungsten-containing gas; and (c) forming a plasma from the processing gas to etch the silicon-containing film.

DETAILED DESCRIPTION

Figure 1:
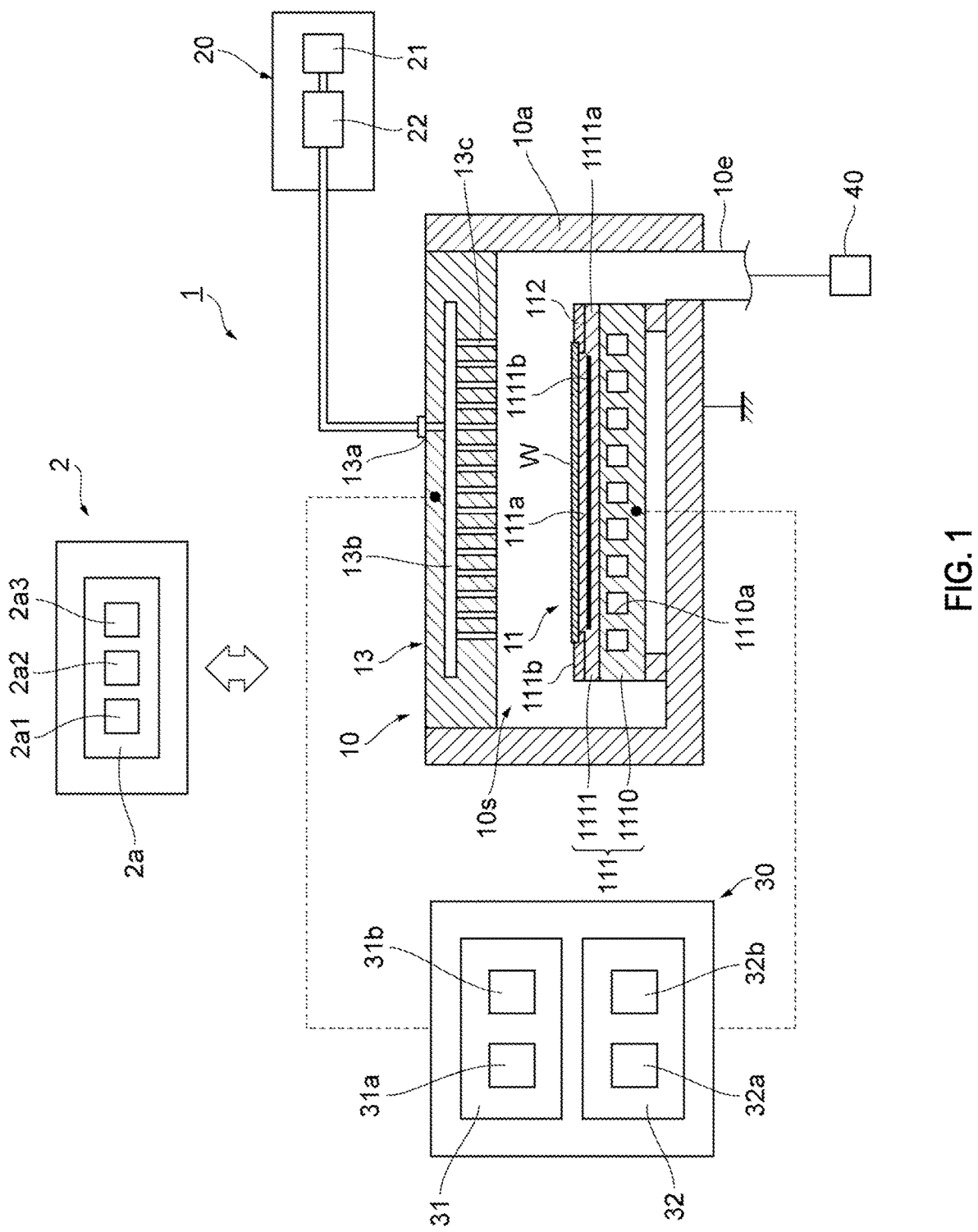
FIG. 1 is a figure schematically illustrating an exemplary plasma processing system.

Embodiments of the present disclosure will now be described.

One exemplary embodiment is a plasma processing method performed in a plasma processing apparatus having a chamber, the method comprising: (a) providing a substrate to a substrate support in the chamber, the substrate having a silicon-containing film and a mask film over the silicon-containing film; (b) supplying a processing gas to the chamber, the processing gas including a tungsten-containing gas and a hydrogen fluoride gas, the flow rate of the hydrogen fluoride gas being higher than the flow rate of the tungsten-containing gas; and (c) forming a plasma from the processing gas to etch the silicon-containing film.

In one exemplary embodiment, the tungsten-containing gas is a $WF_aCl_b$ gas (where a and b are integers equal to or greater than 0 and equal to or less than 6, and the sum of a and b is equal to or greater than 2 and equal to or less than 6).

In one exemplary embodiment, the tungsten-containing gas is at least one of $WF_6$ gas and $WCl_6$ gas.

In one exemplary embodiment, the flow rate of the hydrogen fluoride gas is the highest of the gases included in the processing gas.

In one exemplary embodiment, the flow rate of the tungsten-containing gas is the lowest of the gases included in the processing gas.

In one exemplary embodiment, the flow rate of the tungsten-containing gas is 5% by volume or less relative to the overall flow rate of the processing gas.

In one exemplary embodiment, the flow rate of the hydrogen fluoride gas is at least 10 times that of the tungsten-containing gas.

In one exemplary embodiment, the processing gas further includes at least one gas selected from the group of carbon-containing gases, oxygen-containing gases, and halogen-containing gases other than fluorine.

In one exemplary embodiment, the processing gas further includes a phosphorus-containing gas.

In one exemplary embodiment, the phosphorus-containing gas is a phosphorus halide gas.

In one exemplary embodiment, the carbon-containing gas is $C_xF_y$ gas (where x, y are positive integers) or $C_sH_tF_u$ gas (where s, t, u are positive integers).

In one exemplary embodiment, the temperature of the substrate support in (b) is set to 0° C. or lower.

In one exemplary embodiment, the temperature of the substrate support in (b) is set to −50° C. or lower.

Another exemplary embodiment is a plasma processing method performed in a plasma processing apparatus having a chamber, the method comprising: (a) providing a substrate to a substrate support in the chamber, the substrate having a silicon-containing film and a mask film over the silicon-containing film; (b) supplying a processing gas to the chamber; and (c) forming a plasma from the processing gas to etch the silicon-containing film with the HF species included in the plasma, wherein the processing gas in (b) includes a tungsten-containing gas, and the tungsten-containing gas is supplied to the chamber at a flow rate of 5% by volume or less relative to the overall flow rate of the processing gas.

In one exemplary embodiment, the HF species is produced from at least one gas selected from the group consisting of HF gases and hydrofluorocarbon gases.

In one exemplary embodiment, the HF species is produced from a hydrofluorocarbon gas with two or more carbon atoms.

In one exemplary embodiment, the HF species is produced from at least one gas selected from the group consisting of $CH_2F_2$ gas, $C_3H_2F_4$ gas, $C_3H_2F_6$ gas, and $C_4H_2F_6$ gas.

Another exemplary embodiment is a plasma processing system comprising a chamber, a substrate support provided in the chamber, a plasma generator, and a controller, wherein the controller is configured to cause: (a) provide a substrate to the substrate support, the substrate having a silicon-containing film and a mask film over the silicon-containing film; (b) supplying a processing gas to the chamber, the processing gas including a tungsten-containing gas and a hydrogen fluoride gas, the flow rate of the hydrogen fluoride gas being higher than that the flow rate of the tungsten-containing gas; and (c) forming a plasma from the processing gas to etch the silicon-containing film.

The following is a detailed description of embodiments of the present disclosure with reference to the drawings. In the drawings, identical or similar elements are denoted by the same reference numbers and redundant descriptions of these elements has been omitted. In the following description, positional relationships such as up, down, left and right are based on the positional relationships shown in the drawings except where otherwise specified. The dimensional ratios in the drawings do not indicate actual ratios, and the actual ratios are not limited to the ratios shown in the drawings.

<Configuration of Plasma Processing System>

An example of a configuration for the plasma processing system will now be described. FIG. 1 is a figure used to describe an example of a configuration for a capacitively coupled plasma processing apparatus.

The plasma processing system includes a capacitively coupled plasma processing apparatus 1 and a controller 2. The capacitively coupled plasma processing apparatus 1 includes a plasma processing chamber 10, a gas supply 20, a power supply 30, and an exhaust system 40. The plasma processing apparatus 1 also includes a substrate support 11 and a gas introducer. The gas introducer is configured to introduce at least one processing gas to the plasma processing chamber 10. The gas introducer includes a shower head 13. The substrate support 11 is arranged inside the plasma processing chamber 10. The shower head 13 is arranged above the substrate support 11. In an exemplary embodiment, the shower head 13 constitutes at least a portion of the ceiling of the plasma processing chamber 10. The plasma processing chamber 10 has a plasma processing space 10s defined by the shower head 13, the side walls 10a of the plasma processing chamber 10, and the substrate support 11. The plasma processing chamber 10 has at least one gas supply port for supplying at least one processing gas to the plasma processing space 10s, and at least one gas exhaust port for exhausting gas from the plasma processing space. The plasma processing chamber 10 is grounded. The shower head 13 and the substrate support 11 are electrically isolated from the plasma processing chamber 10.

The substrate support 11 includes a main body 111 and a ring assembly 112. The main body 111 has a central region 111a for supporting a substrate W and an annular region 111b for supporting the ring assembly 112. A wafer is an example of a substrate W. The annular region 111b of the main body 111 surrounds the central region 111a of the main body 111 in a plan view. The substrate W is arranged in the central region 111a of the main body 111, and the ring assembly 112 is arranged in the annular region 111b of the main body 111 so as to surround the substrate W in the central region 111a of the main body 111. Therefore, the central region 111a is also known as the substrate support surface for supporting the substrate W, and the annular region 111b is known as the ring support surface for supporting the ring assembly 112.

In one embodiment, the main body 111 includes a base 1110 and an electrostatic chuck 1111. The base 1110 includes a conductive member. The conductive member of the base 1110 can function as a lower electrode. The electrostatic chuck 1111 is arranged on the base 1110. The electrostatic chuck 1111 includes a ceramic member 1111a and an electrostatic electrode 1111b disposed within the ceramic member 1111a. The ceramic member 1111a has a central region 111a. In one embodiment, the ceramic member 1111a also has an annular region 111b. Note that another member surrounding the electrostatic chuck 1111, such as an annular electrostatic chuck or an annular insulating member, may have the annular region 111b. In this case, the ring assembly 112 may be disposed on the annular electrostatic chuck or the annular insulating member, or may be disposed on both the electrostatic chuck 1111 and the annular insulating member. An RF or DC electrode may also be placed within the ceramic member 1111a, in which case the RF or DC electrode functions as the lower electrode. An RF or DC electrode is also referred to as a bias electrode if bias RF signals or DC signals described below are connected to the RF or DC electrode. Note that both the conductive member of the base 1110 and the RF or DC electrode may function as two lower electrodes.

The ring assembly 112 includes one or more annular members. In one embodiment, the one or more annular members include one or more edge rings and at least one cover ring. The edge ring or rings is made of a conductive material or an insulating material, and the cover ring is made of an insulating material.

Also, the substrate support 11 may include a temperature control module configured to keep at least one of the electrostatic chuck 1111, the ring assembly 112, and the substrate at a target temperature. The temperature control module may include a heater, a heat transfer medium, a flow path 1110a, or combinations of these. A heat transfer fluid such as brine or a gas flows through the flow path 1110a. In one embodiment, flow paths 1110a are formed in the base 1110 and one or more heaters are disposed in the ceramic member 1111a of electrostatic chuck 1111. The substrate support 11 may also include a heat transfer gas supply configured to supply a heat transfer gas between the back surface of the substrate W and the central region 111a.

The shower head 13 is configured to introduce at least one processing gas from the gas supply 20 to the plasma processing space 10s. The shower head 13 has at least one gas supply port 13a, at least one gas diffusion chamber 13b, and multiple gas introduction ports 13c. The processing gas supplied to the gas supply port 13a passes through the gas diffusion chamber 13b and is introduced to the plasma processing space 10s via the gas introduction ports 13c. The shower head 13 also includes an upper electrode. In addition to the showerhead 13, the gas introducer may include one or more side gas injectors (SGI) attached to one or more openings formed in a side wall 10a.

The gas supply 20 may include at least one gas source 21 and at least one flow controller 22. In one embodiment, the gas supply 20 is configured to supply at least one processing gas from its respective gas source 21 via its respective flow controller 22 to the shower head 13. Each flow controller 22 may include, for example, a mass flow controller or a pressure-controlled flow controller. The gas supply 20 may also include one or more flow modulating devices that modulate or pulse the flow rate of at least one processing gas.

The power supply 30 includes an RF power supply 31 serving as the first power supply coupled to the plasma processing chamber 10 via at least one impedance matching circuit. The RF power supply 31 is configured to supply at least one RF signal (RF power), such as a source RF signal and a bias RF signal, to at least one lower electrode and/or to at least one upper electrode. In this way, a plasma is formed from at least one processing gas supplied to the plasma processing space 10s. Thus, the RF power supply 31 may function as at least part of a plasma generator configured to form a plasma from one or more processing gases in the plasma processing chamber 10. Also, by supplying a bias RF signal to at least one lower electrode, a bias potential is generated in the substrate W, and ion components in the formed plasma can be attracted to the substrate W.

In one embodiment, the RF power supply 31 includes a first RF generator 31a and a second RF generator 31b. The first RF generator 31a is coupled to at least one lower electrode and/or to at least one upper electrode via at least one impedance matching circuit and configured to generate a source RF signal (source RF power) for plasma generation. In one embodiment, the source RF signal has a frequency in the range from 10 MHz to 150 MHz. In one embodiment, the first RF generator 31a may be configured to generate multiple source RF signals with different frequencies. One or more source RF signals generated are provided to at least one lower electrode and/or to at least one upper electrode.

A second RF generator 31b is coupled to the at least one lower electrode via at least one impedance matching circuit and configured to generate a bias RF signal (bias RF power). The frequency of the bias RF signal may be the same as or different from the frequency of the source RF signal. In one embodiment, the bias RF signal has a frequency lower than that of the source RF signal. In one embodiment, the bias RF signal has a frequency in the range from 100 kHz to 60 MHz. In one embodiment, the second RF generator 31b may be configured to generate multiple bias RF signals with different frequencies. One or more bias RF signals that have been generated are supplied to at least one lower electrode. Also, in various embodiments, at least one of the source RF signal and the bias RF signal may be pulsed.

The power supply 30 may also include a DC power supply 32 coupled to the plasma processing chamber 10. The DC power supply 32 includes a first DC generator 32a and a second DC generator 32b. In one embodiment, the first DC generator 32a is connected to at least one lower electrode and configured to generate a first DC signal. A generated first bias DC signal is supplied to at least one lower electrode. In one embodiment, the second DC generator 32b is connected to at least one upper electrode and configured to generate a second DC signal. The generated second DC signal is supplied to at least one upper electrode.

In various embodiments, at least one of the first and second DC signals may be pulsed. In this case, a sequence of DC-based voltage pulses is supplied to at least one lower electrode and/or at least one upper electrode. The voltage pulses may have rectangular, trapezoidal or triangular pulse waveforms, or some combination of these pulse waveforms. In one embodiment, a waveform generator for generating a sequence of voltage pulses from a DC signal is connected between the first DC generator 32a and at least one lower electrode. Thus, the first DC generator 32a and the waveform generator constitute a voltage pulse generator. When a second DC generator 32b and a waveform generator constitute a voltage pulse generator, the voltage pulse generator is connected to at least one upper electrode. The voltage pulse may have a positive polarity or a negative polarity. Also, the sequence of voltage pulses may include one or more positive voltage pulses and one or more negative voltage pulses in a single cycle. Note that first and second DC generators 32a, 32b may be provided in addition to the RF power supply 31, or a first DC generator 32a may be provided instead of a second RF generator 31b.

The exhaust system 40 can be connected, for example, to a gas outlet 10e provided at the bottom of the plasma processing chamber 10. The exhaust system 40 may include a pressure regulating valve and a vacuum pump. The pressure control valve regulates the pressure inside the plasma processing space 10s. The vacuum pump may include a turbo molecular pump, a dry pump, or a combination of these.

The controller 2 processes computer-executable instructions that get the plasma processing apparatus 1 to perform the steps described in the present disclosure. The controller 2 may be configured to get each element in the plasma processing apparatus 1 to perform the steps described in the present specification. In an exemplary embodiment, some or all of the controller 2 may be provided as part of the plasma processing apparatus 1. The controller 2 may include, for example, a computer 2a. The computer 2a may include, for example, a central processing unit (CPU) 2a1, a storage 2a2, and a communication interface 2a3. The central processing unit 2a1 may be configured to perform control operations by retrieving a program from the storage 2a2 and executing the retrieved program. This program may be stored in the storage 2a2 in advance or may be acquired via another medium when necessary. The acquired program is stored in the storage 2a2, retrieved from the storage 2a2 and executed by the central processing unit 2a1. The medium may be any storage medium readable by the computer 2a or may be a communication line connected to the communication interface 2a3. The storage 2a2 may include random access memory (RAM), read-only memory (ROM), a hard disk drive (HDD), a solid state drive (SSD), or a combination of these. The communication interface 2a3 may communicate with other configurations in the plasma processing apparatus 1 via a communication line such as a local area network (LAN).

<Example of the Plasma Processing Method>

Figure 2:
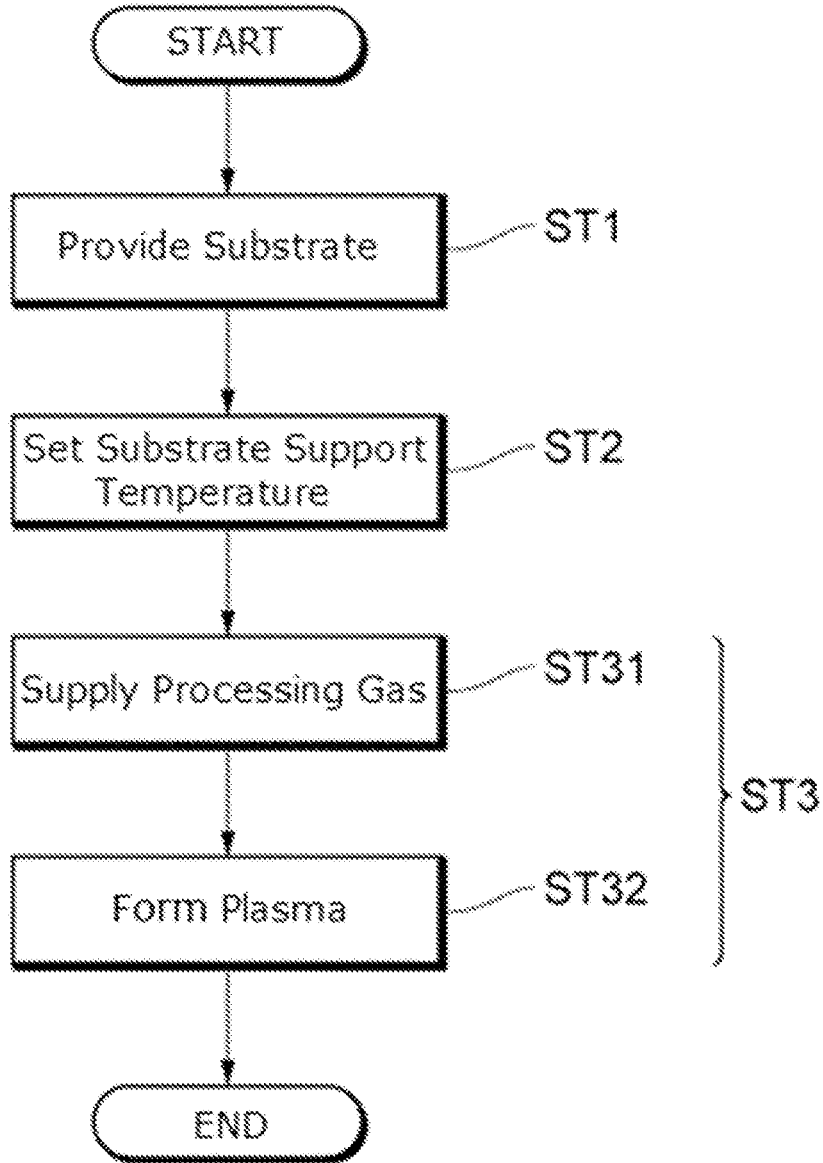
FIG. 2 is a flowchart showing an example of the processing method.

FIG. 2 is a flowchart showing an example of the plasma processing method in an exemplary embodiment ("the processing method" below). As shown in FIG. 2, the processing method includes a step ST1 of providing a substrate, a step ST2 of setting the temperature of the substrate support, and a step ST3 of etching an etching target film on the substrate. The processing in each step may be performed by the plasma processing system shown in FIG. 1. An example will now be described in which the controller 2 controls each unit in the plasma processing apparatus 1 to perform the processing method on a substrate W.

(Step ST1: Providing a Substrate)

In step ST1, a substrate W is provided in the plasma processing space 10s in the plasma processing apparatus 1. The substrate W is arranged on the upper surface of the substrate support 11 so as to face the upper electrode, and is held in place on the substrate support 11 by the electrostatic chuck 1111.

Figure 3:
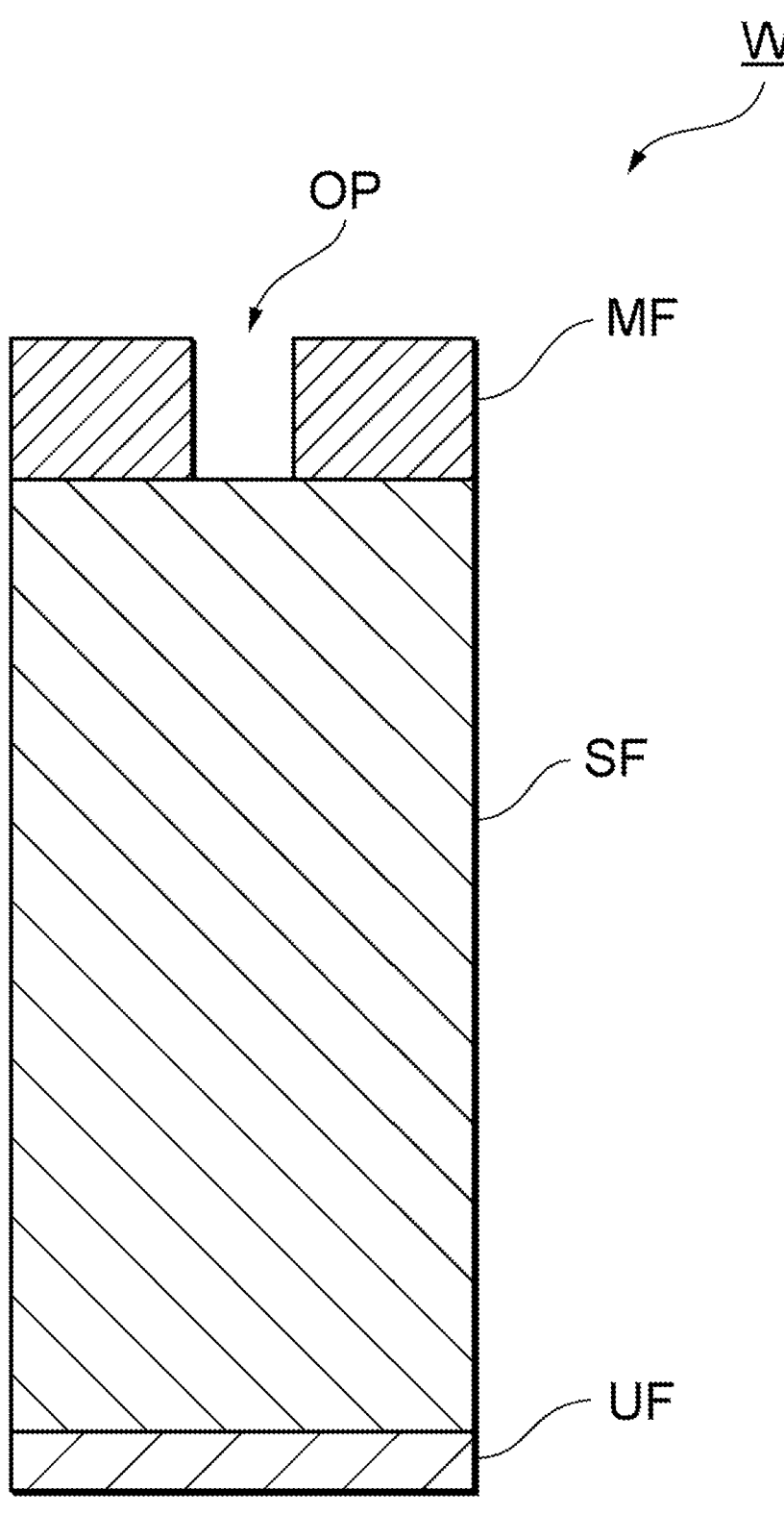
FIG. 3 is a figure illustrating an example of a cross-sectional structure of a substrate W.

FIG. 3 is a figure illustrating an example of a cross-sectional structure of the substrate W provided in step ST1. An etching target film EF and a mask film MF are formed in this order on the underlying film UF of the substrate W. The substrate W may be used, for example, in the production of semiconductor devices including semiconductor memory devices such as DRAMs and 3D-NAND flash memories.

The underlying film UF may be, for example, a silicon wafer or an organic film, dielectric film, metal film, or semiconductor film formed on the silicon wafer. The underlying film UF may be configured by stacking multiple films.

The etching target film EF may be a silicon-containing film. The silicon-containing film SF may be, for example, a silicon oxide film, a silicon nitride film, or a silicon oxynitride film. The etching target film EF may be configured by stacking multiple films. For example, the etching target film EF may be formed by alternately stacking a silicon oxide film and a polycrystalline silicon film. Also, the etching target film EF may be configured by alternately stacking a silicon oxide film and a silicon nitride film.

The underlying film UF and/or the etching target film EF may be formed, for example, using the CVD method or the spin coating method. The underlying film UF and/or the etching target film EF may be a flat film, or may be a film with unevenness.

The mask film MF is formed on the etching target film EF. The mask film MF defines at least one opening OP on the etching target film EF. The opening OP is a space above the etching target film EF surrounded by the sidewalls of the mask film MF. Specifically, in FIG. 3, the upper surface of the etching target film EF has a region covered with the mask film MF and a region exposed at the bottom of the opening OP.

The opening OP may have any shape when the substrate W is viewed from above, that is, when the substrate W is viewed downward from above in FIG. 3. The shape of the opening may be, for example, a circle, an ellipse, a rectangle, a line, or a shape combining one or more of these. The mask film MF may have multiple side walls, and the multiple side walls may define multiple openings OP. The openings OP may each have a linear shape and may be arranged at regular intervals to form a line and space pattern. Alternatively, the openings OP may each have a hole shape and form an array pattern.

The mask film MF may be, for example, a polysilicon film, a boron-doped silicon film, a tungsten-containing film (such as WC film or WSi film), an amorphous carbon film, a tin oxide film, or a titanium-containing film (such as TiN film). The mask film MF may be a single layer mask consisting of one layer or a multilayer mask consisting of two or more layers. The mask film MF may be formed using the CVD method or the spin coating method. The mask film MF may be formed by lithography. The opening OP may be formed by etching the mask film MF.

At least a portion of the process of forming each structure on the substrate W may be performed in the plasma processing chamber 10. In one example, the step of etching the mask film MF to form an opening OP may be performed in the plasma processing chamber 10. In other words, etching of the opening OP and the etching target film EF described later may be continuously performed in the same chamber. Also, the substrate W may be carried into the plasma processing space 10s of the plasma processing apparatus 1 and placed on the upper surface of the substrate support 11 after some or all of each structure on the substrate W has been formed in an apparatus or chamber outside of the plasma processing apparatus 1.

(Step ST2: Setting the Temperature of the Substrate Support)

In step ST2, the temperature of the substrate support 11 is set to a target temperature. The target temperature may be, for example, 0 degrees or lower. The target temperature may be −10° C. or lower, −20° C. or lower, −30° C. or lower, −40° C. or lower, −50° C. or lower, −60° C. or lower, or −70° C. or lower.

Setting the temperature of the substrate support 11 includes, but is not limited to, measuring the temperature of the substrate support 11 and adjusting the temperature of the substrate support 11 using a temperature control module so that the temperature of the substrate support 11 reaches the target temperature. In one example, setting the temperature of the substrate support 11 includes (a) setting the temperature of the substrate W or the temperature of a heat transfer fluid flowing through a flow path 1110a to the target temperature or a temperature different from the target temperature so that the temperature of the substrate support 11 reaches the target temperature, and (b) setting the temperature of the substrate support 11 or the heat-transfer fluid flowing through the flow path 1110a to the target temperature or a temperature different from the target temperature so that the temperature of the substrate W reaches the target temperature. Also, "setting" the temperature includes inputting, selecting, or storing the temperature in the controller 2.

Note that step ST2 may be performed before step ST1 in the processing method. In other words, the substrate W may be provided to the substrate support 11 after setting the temperature of the substrate support 11 to the target temperature.

(Step ST3: Etching the Etching Target Film EF)

In step ST3, the etching target film EF is etched. Step ST3 includes a step ST31 of supplying a processing gas and a step ST32 of forming a plasma from the processing gas. During the processing in step ST3, the temperature of the substrate support 11 is set to the target temperature that was set in step ST2.

In step ST31, the processing gas is supplied from the gas supply 20 to the plasma processing space 10s. The processing gas includes a hydrogen fluoride (HF) gas and a tungsten-containing gas. The HF gas has a higher flow rate than the tungsten-containing gas.

Among the processing gases, the HF gas may have the highest flow rate. In one example, the HF gas may be 70% by volume or more, or 80% by volume or more, relative to the total flow rate of the processing gas. The flow rate of the HF gas may be 10 times or more, 50 times or more, 100 times or more, 300 times or more, 500 times or more than that of the tungsten-containing gas.

A gas capable of producing a HF species in the chamber may be used in place of or along with a HF gas in the processing gas. HF species include hydrogen fluoride gases, radicals and/or ions. The HF species may be produced from at least one gas selected from the group consisting of HF gases and hydrofluorocarbon gases. A HF species may also be produced from a hydrofluorocarbon gas having two or more carbon atoms. The gas capable of generating a HF species may be, for example, at least one gas selected from the group consisting of $CH_2F_2$ gas, $C_3H_2F_4$ gas, $C_3H_2F_6$ gas, $C_3H_3F_5$ gas, $C_4H_2F_6$ gas, $C_4H_5F_5$ gas, $C_4H_2F_8$ gas, $C_5H_2F_6$ gas, $C_5H_2F_{10}$ gas, and $C_5H_3F_7$ gas. In one example, at least one gas selected from the group consisting of $CH_2F_2$ gas, $C_3H_2F_4$ gas, $C_3H_2F_6$ gas, and $C_4H_2F_6$ gas is used as the gas capable of generating a HF species.

The tungsten-containing gas may be a gas containing tungsten and a halogen. One example is a $WF_aCl_b$ gas (where a and b are each an integer equal to or greater than 0 and equal to or less than 6, and the sum of a and b is equal to or greater than 2 and equal to or less than 6). Specific examples of tungsten-containing gases include gases containing tungsten and fluorine, such as tungsten difluoride ($WF_2$) gas, tungsten tetrafluoride ($WF_4$) gas, tungsten pentafluoride ($WF_5$) gas, and tungsten hexafluoride ($WF_6$) gas, and gases containing tungsten and chlorine, such as tungsten dichloride ($WCl_2$) gas, tungsten tetrachloride ($WCl_4$) gas, tungsten pentachloride ($WCl_5$) gas, and tungsten hexachloride ($WCl_6$) gas. Among these, at least one of $WF_6$ gas and $WCl_6$ gas may be used. The flow rate of the tungsten-containing gas relative to the overall flow rate of the processing gas may be 5% by volume or less, 1% by volume or less, 0.5% by volume or less, or 0.2% by volume or less.

The processing gas may further contain at least one gas selected from the group consisting of carbon-containing gases, oxygen-containing gases, and gases containing a halogen other than fluorine.

The carbon-containing gas may be a $C_xF_y$ gas (where x, y are positive integers). The $C_xF_y$ gas may include at least one gas selected from the group consisting of $C_2F_2$ gas, $C_2F_4$ gas, $C_3F_6$ gas, $C_3F_8$ gas, $C_4F_6$ gas, $C_4F_8$ gas, and $C_5F_8$ gas. The carbon-containing gas may be a $C_sH_tF_u$ gas (where s, t, u are positive integers). $C_sH_tF_u$ gases include at least one gas selected from the group consisting of $CHF_3$ gas, $CH_2F_2$ gas, $CH_3F$ gas, $C_2HF_5$ gas, $C_2H_2F_4$ gas, $C_2H_3F_3$ gas, $C_2H_4F_2$ gas, $C_3HF_7$ gas, $C_3H_2F_2$ gas, $C_3H_2F_4$ gas, $C_3H_2F_6$ gas, $C_3H_3F_5$ gas, $C_4H_2F_6$ gas, $C_4H_5F_5$ gas, $C_4H_2F_8$ gas, $C_5H_2F_6$, $C_5H_2F_{10}$ gas, and $C_5H_3F_7$ gas. The processing gas may include both a $C_xF_y$ gas and a $C_sH_tF_u$ gas.

The oxygen-containing gas may be, for example, at least one gas selected from the group consisting of $O_2$, CO, $CO_2$, $H_2O$, and $H_2O_2$. In one example, the processing gas may include an oxygen-containing gas other than $H_2O$, that is, at least one gas selected from the group consisting of $O_2$, CO, $CO_2$, and $H_2O_2$. The flow rate of the oxygen-containing gas may be adjusted according to the flow rates of the $C_xF_y$ gas and the $C_sH_tF_u$ gas.

The gas containing a halogen other than fluorine may be a chlorine-containing gas, a bromine-containing gas and/or an iodine-containing gas. The chlorine-containing gases that may be used include gases such as $Cl_2$, $SiCl_2$, $SiCl_4$, $CCl_4$, $SiH_2Cl_2$, $Si_2Cl_6$, $CHCl_3$, $SO_2Cl_2$, $BCl_3$, $PCl_3$, $PCl_5$, and $POCl_3$. The bromine-containing gases that may be used include gases such as $Br_2$, HBr, $CBr_2F_2$, $C_2F_5Br$, $PBr_3$, $PBr_5$, $POBr_3$, and $BBr_3$. Iodine-containing gases that may be used include gases such as HI, $CF_3I$, $C_2F_5I$, $C_3F_7I$, $IF_5$, $IF_5$, $I_2$, and $PI_3$. In one example, at least one gas selected from the group consisting of $Cl_2$ gas, $Br_2$ gas, and HBr gas is used as the halogen-containing gas. In another example, $Cl_2$ gas and HBr gas are used as halogen-containing gases.

The processing gas may also contain a phosphorus-containing gas. The phosphorus-containing gas may be at least one gas selected from the group consisting of $PF_3$ gas, $PF_5$ gas, $POF_3$ gas, $HPF_6$ gas, $PCl_3$ gas, $PCl_5$ gas, $POCl_3$ gas, $PBr_3$ gas, $PBr_5$ gas, $POBr_3$ gas, $PI_3$ gas, $P_4O_{10}$ gas, $P_4O_8$ gas, $P_4O_6$ gas, $PH_3$ gas, $Ca_3P_2$ gas, $H_3PO_4$ gas, and $Na_3PO_4$ gas. Among these gases, phosphorus halide-containing gases such as $PF_3$ gas, $PF_5$ gas, and $PCl_3$ gas may be used, and phosphorus fluoride gases such as $PF_3$ gas and $PF_5$ gas may be used.

In step ST32, a source RF signal (RF power) is supplied from the first RF generator 31a to the lower electrode and/or the upper electrode. This forms a plasma from the processing gas. Also, a bias RF signal is supplied to the lower electrode from the second RF generator 31b as a bias signal (power). This generates a bias potential in the substrate. Active species such as ions and radicals in the formed plasma are attracted to the substrate W, and the etching target film EF is etched via an opening OP in the mask film MF. The temperature of the substrate support 11 is set to the target temperature in the manner described above during etching.

The timing for starting supply of the source RF signal and the timing for starting supply of the bias signal may be the same or different. A bias DC signal may be used as the bias signal (power). In other words, a bias potential may be generated on the substrate W by supplying a negative bias DC signal from the DC generator 32a to the lower electrode.

The source RF signal and the bias signal may both be continuous waves, or one may be continuous and the other pulsed. Also, the duty ratio of the pulse wave for the bias signal may be set to the appropriate ratio. For example, the duty ratio may be 30% or less, or 20% or less. The duty ratio of the bias signal is the ratio of the period in which the power or voltage level is high in the pulse wave period.

Figure 4:
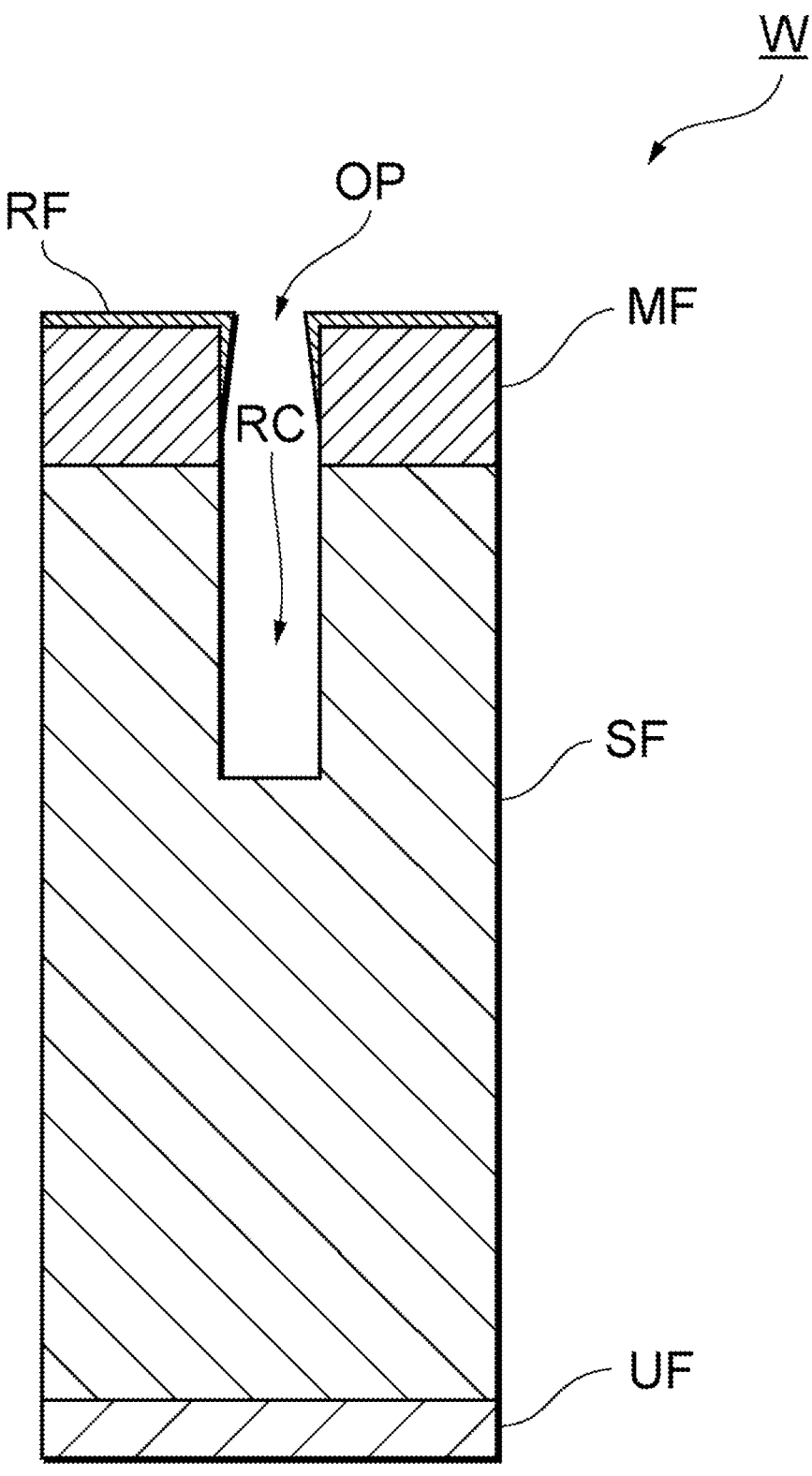
FIG. 4 is a figure illustrating an example of a cross-sectional structure of a substrate W during the processing in ST32.

FIG. 4 is a figure illustrating an example of a cross-sectional structure of a substrate W during the processing in step ST32. As shown in FIG. 4, a protective film PF containing tungsten is formed on the mask film MF. The protective film PF is formed by, for example, reducing tungsten in the tungsten-containing gas using an active species of hydrogen in the plasma, which adheres to and is deposited on the mask film MF. Protective film PF is formed at least on the sidewalls of the mask film MF. The protective film PF may also be formed on the upper surface of the mask film MF.

The tungsten in the protective film PF has low reactivity with HF species in the plasma. This suppresses removal of the sidewalls of the mask film MF by etching performed during step ST32. This, in turn, suppresses expanded bowing CD of the mask film MF (that is, it suppresses bowing). In one example, the bowing CD may be the maximum width of an opening OP in the mask film MF or a recess RC in the protective film PF.

Figure 5:
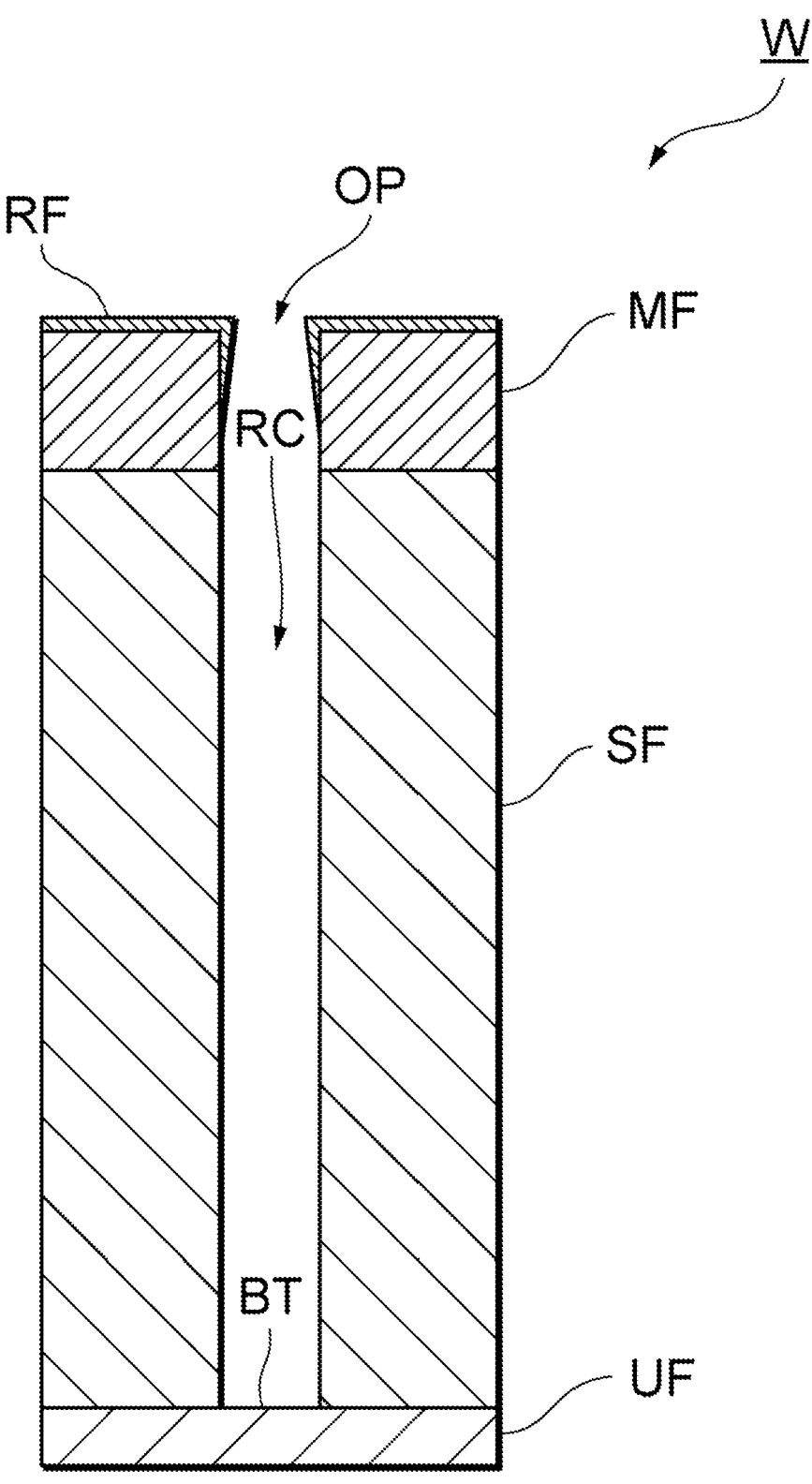
FIG. 5 is a figure illustrating an example of a cross-sectional structure of a substrate W after the processing in ST32.

FIG. 5 is a figure illustrating an example of a cross-sectional structure of the substrate W after the processing in ST32. As shown in FIG. 5, step ST32 is ended when the bottom BT of the recess RC formed in the etching target film EF by etching reaches the underlying film UF and the surface of the underlying film UF is exposed. Because bowing of the mask film MF is suppressed during execution of step ST32, bowing of the recess RC formed in the etching target film EF is also suppressed. In this way, the processing method can suppress shape defects in the recess RC formed in the etching target film EF. The aspect ratio of the recess RC may be 20 or more, 30 or more, 40 or more, 50 or more, or 100 or more.

EXAMPLES

Examples of the processing method will now be described. The present disclosure is not limited in any way by the following examples.

Examples 1 and 2

In Examples 1 and 2, the processing method was applied using the plasma processing apparatus 1 to etch a substrate with the same structure as the substrate W shown in FIG. 3. A polysilicon film was used as the mask film MF. A two-layer film obtained by forming a silicon nitride film on a silicon oxide film was used as the etching target film EF. The processing gas contained HF gas, $WF_6$ gas, $C_4F_8$ gas, and $O_2$ gas. The processing gas in Example 1 contained 85% by volume or more of HF gas and 0.2% by volume of $WF_6$ gas. The processing gas in Example 2 contained 85% by volume or more of HF gas and 0.5% by volume of $WF_6$ gas. The target temperature of the substrate support during etching was set to –70° C. As the bias signal, a pulse wave of a bias DC signal was supplied to the lower electrode at a duty ratio of 20%.

Reference Example 1

Substrates similar to those in Examples 1 and 2 were etched using the plasma processing apparatus 1. The processing gas in Reference Example 1 contained HF gas, $C_4F_8$ gas and $O_2$ gas, and did not contain $WF_6$ gas. Etching was performed under the same etching conditions as in Examples 1 and 2 except for this difference.

Figure 6:
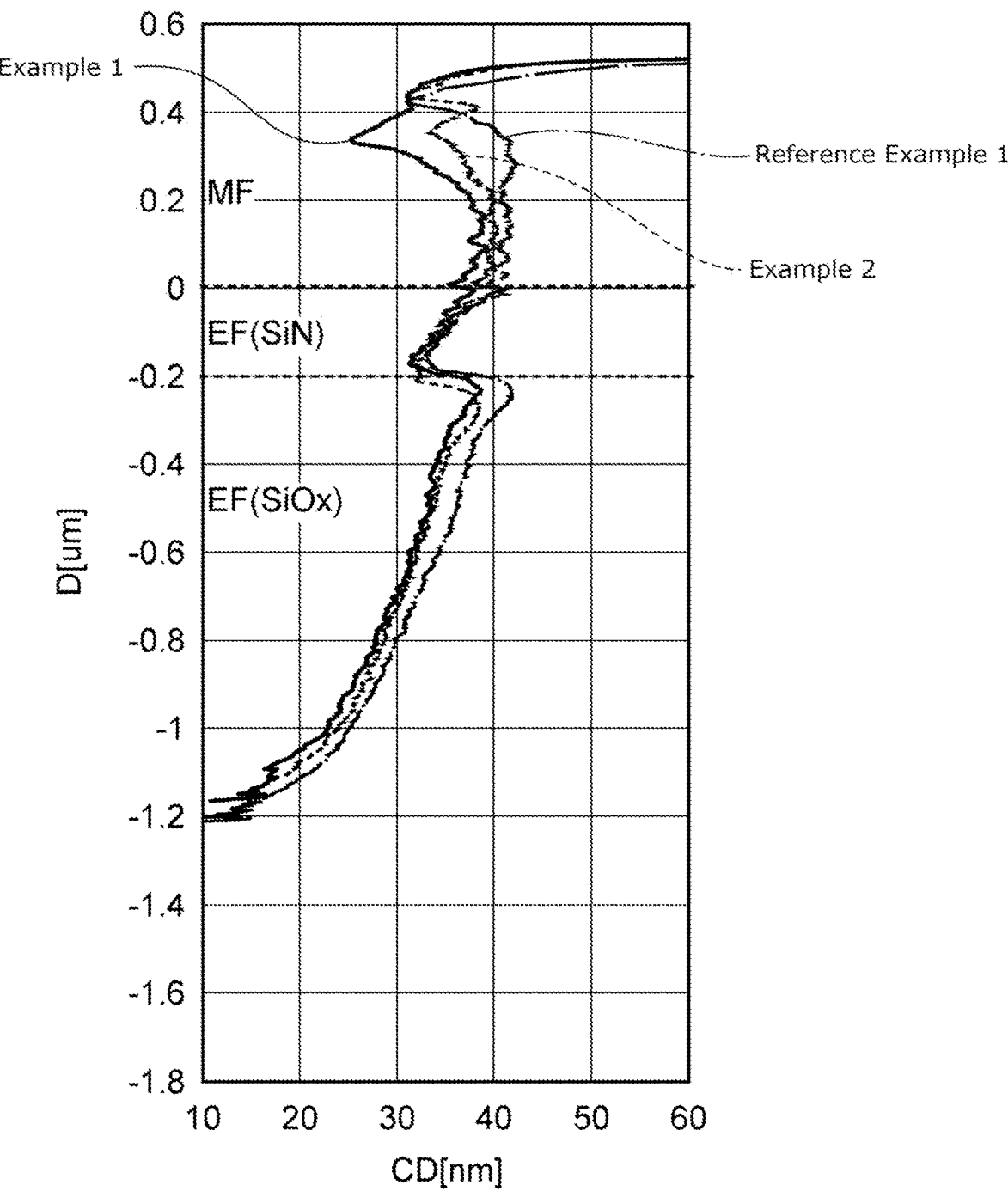
FIG. 6 is a figure showing the etching results for examples of the present invention and a reference example.

FIG. 6 is a figure showing the etching results for Example 1, Example 2, and Reference Example 1. In FIG. 6, the vertical axis represents the depth D [μm] of the recesses formed in the opening OP of the mask film MF and the etching target film EF. Near 0 μm on the vertical axis is the boundary between the mask film MF and the silicon nitride film (SiN). Near –0.2 μm on the vertical axis is the boundary between the silicon nitride film (SiN) and the silicon oxide film (SiOx). In FIG. 6, the horizontal axis represents the opening width CD [nm] of the opening OP in the mask film MF and the recess RC formed in the etching target film EF.

As shown in FIG. 6, Example 1 and Example 2 including $WF_6$ gas as a processing gas suppressed bowing of the mask film MF and the silicon oxide film (SiOx) compared with the Reference Example which did not include $WF_6$ gas. The bowing CD of the mask film MF and the silicon oxide film (SiOx) in Example 1 were 41 and 39, respectively. The bowing CD of the mask film MF and the silicon oxide film (SiOx) in Example 2 were 43 and 39, respectively. In contrast, the bowing CD of the mask film MF and the silicon oxide film (SiOx) in Reference Example 1 were 45 and 42, respectively. In Example 1, bowing CD of the silicon oxide film (SiOx) was suppressed to the same extent as in Example 2 ($WF_6$ gas: 0.5 vol %), even though it contained less $WF_6$ gas ($WF_6$ gas: 0.2 vol %).

Examples 3 and 4

The processing method was applied using the plasma processing apparatus 1 to etch substrates similar to those in Examples 1 and 2. The processing gases in Examples 3 and 4 were the same as those in Example 1 and Example 2 except that they contained 0.3 vol % of $WF_6$ gas. In Example 3, the duty ratio of the pulse wave for the bias DC signal was set to 30%. In Example 4, the duty ratio of the pulse wave for the bias DC signal was set to 20%. Etching was performed under the same etching conditions as in Examples 1 and 2 except for these differences.

Figure 7:
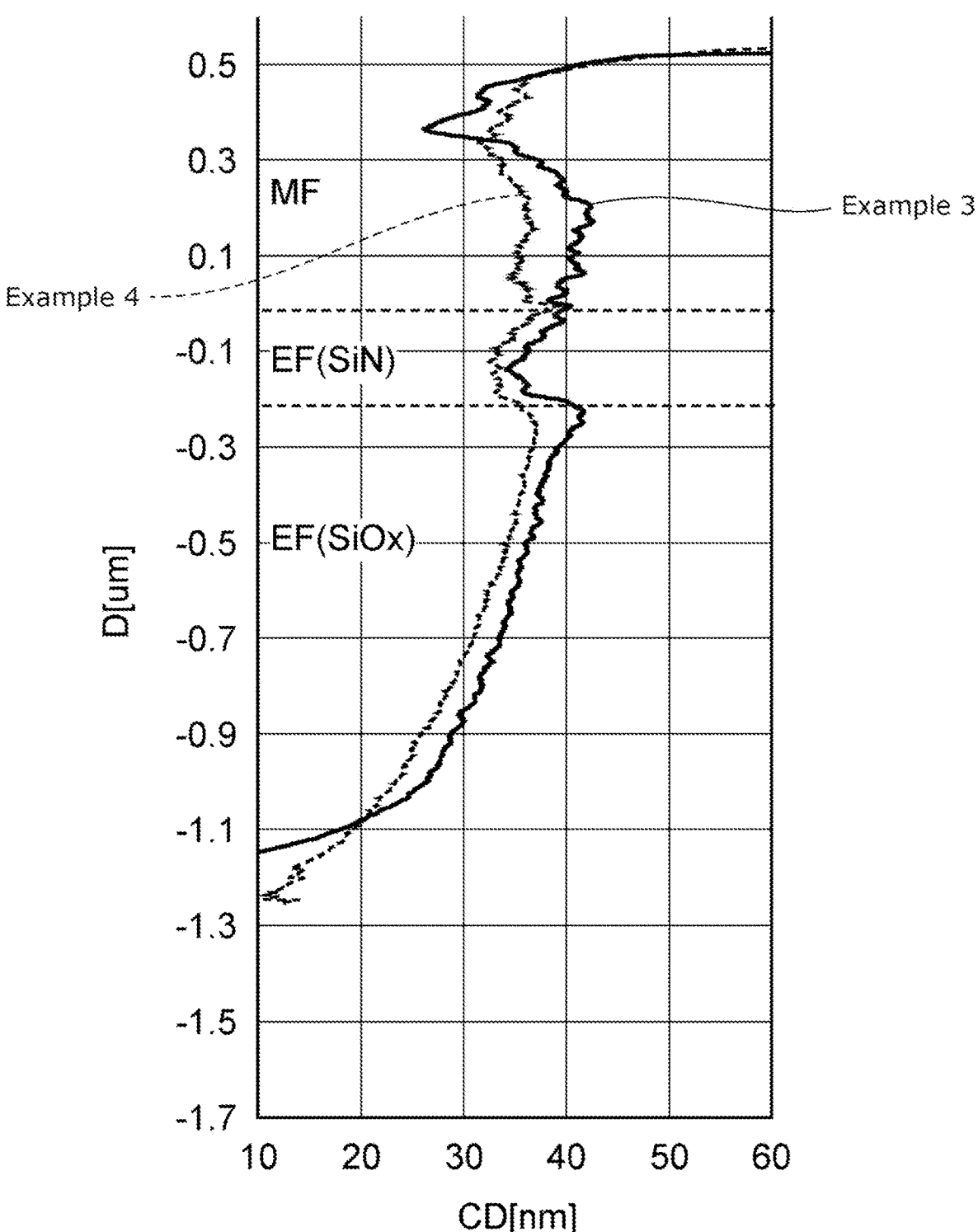
FIG. 7 is a figure showing the etching results for examples of the present invention.

FIG. 7 is a figure showing the etching results for Examples 3 and 4 of the present invention. The vertical axis and horizontal axis in FIG. 7 are the same as those in FIG. 6. As shown in FIG. 7, bowing of the mask film MF and the silicon oxide film (SiOx) was suppressed in both Examples 3 and 4. Example 4, which had a bias DC signal duty ratio of 20%, had a greater bowing suppressing effect than Example 3, which had a duty ratio of 30%. This is probably because the low duty ratio decreased the relative amount of ions colliding with the substrate W, which appears to have increased the protective effect of the protective film PF on the mask film MF.

Embodiments of the present disclosure also encompass the following aspects.
(Addendum 1)

An etching gas composition comprising a tungsten-containing gas and a hydrogen fluoride gas having a flow rate that is higher than that of the tungsten-containing gas.
(Addendum 2)

A device production method performed in a plasma processing apparatus having a chamber, the method comprising:

(a) providing a substrate to a substrate support in the chamber, the substrate having a silicon-containing film and a mask film over the silicon-containing film; and (b) forming a plasma from a processing gas to etch the silicon-containing film, the processing gas containing a tungsten-containing gas and a hydrogen fluoride gas, the flow rate of the hydrogen fluoride gas being higher than the flow rate of the tungsten-containing gas.
(Addendum 3)

A program for a computer of a plasma processing system, the plasma processing system comprising a chamber, a substrate support provided in the chamber, and a plasma generator, the program causing the computer to execute:

(a) provide a substrate to the substrate support, the substrate having a silicon-containing film and a mask film over the silicon-containing film; and (b) form a plasma from a processing gas using power supplied from the plasma generator to etch the silicon-containing film. the processing gas containing a tungsten-containing gas and a hydrogen fluoride gas, the flow rate of the hydrogen fluoride gas is higher than the flow rate of the tungsten-containing gas.
(Addendum 4)

A storage medium that stores the program described in addendum 3.

Various modifications may be made to the processing method without departing from the scope and spirit of this disclosure. For example, the processing method may be performed using a plasma processing apparatus using a plasma source other than that of a capacitively coupled plasma processing apparatus 1, such as inductively coupled plasma or microwave plasma.

In one exemplary embodiment of the present disclosure, a technique can be provided that suppresses morphological abnormalities in the etching process.

The embodiments described above were provided for illustrative purposes only and are not intended to limit the scope of the present disclosure. Various modifications may be applied to each of these embodiments without departing from the scope and spirit of the present disclosure. For example, some elements in one embodiment can be added to another embodiment. Also, some elements in one embodiment can be replaced with corresponding elements from another embodiment.

The invention claimed is:

1. A plasma processing method performed in a plasma processing apparatus having a chamber, the method comprising:

(a) providing a substrate to a substrate support in the chamber, the substrate having a silicon-containing film and a mask film over the silicon-containing film;

(b) supplying a processing gas to the chamber, the processing gas including a tungsten-containing gas, a hydrogen fluoride gas, a phosphorus-containing gas, and at least one gas selected from the group consisting of carbon-containing gases, oxygen-containing gases, and halogen-containing gases other than fluorine, wherein a flow rate of the tungsten-containing gas is the lowest of gases included in the processing gas, and the flow rate of the tungsten-containing gas is 1% by volume or less relative to an overall flow rate of the processing gas; and (c) forming a plasma from the processing gas to etch the silicon-containing film, wherein, in (c), the etching of the silicon-containing film is conducted while forming a protective film on the mask film by tungsten in the tungsten-contained gas.

2. The plasma processing method according to claim 1, wherein the tungsten-containing gas is a $WF_aCl_b$ gas (where a and b are integers equal to or greater than 0 and equal to or less than 6, and sum of a and b is equal to or greater than 2 and equal to or less than 6).

3. The plasma processing method according to claim 1, wherein the tungsten-containing gas is at least one of $WF_6$ gas and $WCl_6$ gas.

4. The plasma processing method according to claim 1, wherein the flow rate of the hydrogen fluoride gas is the highest of the gases included in the processing gas.

5. The plasma processing method according to claim 1, wherein the flow rate of the hydrogen fluoride gas is at least 10 times that of the tungsten-containing gas.

6. The plasma processing method according to claim 1, wherein the carbon-containing gas is $C_xF_y$ gas (where x, y are positive integers) or $C_sH_tF_u$ gas (where s, t, u are positive integers).

7. The plasma processing method according to claim 1, wherein the phosphorus-containing gas is a phosphorus halide gas.

8. The plasma processing method according to claim 1, wherein temperature of the substrate support in (c) is set to 0° C. or lower.

9. The plasma processing method according to claim 8, wherein the temperature of the substrate support in (c) is set to −50° C. or lower.

10. The plasma processing method according to claim 1, wherein the flow rate of the tungsten-containing gas is 0.5% by volume or less relative to the overall flow rate of the processing gas.

11. The plasma processing method according to claim 1, wherein the flow rate of the hydrogen fluoride gas is 70% by volume or more relative to a total flow rate of the processing gas.

12. The plasma processing method according to claim 1, wherein the flow rate of the hydrogen fluoride gas is at least 100 times that of the tungsten-containing gas.

13. The plasma processing method according to claim 1, wherein the protective film is formed at least on sidewalls of the mask film, and wherein forming the protective film suppresses bowing of the mask film.

14. A plasma processing method performed in a plasma processing apparatus having a chamber, the method comprising:

(a) providing a substrate to a substrate support in the chamber, the substrate having a silicon-containing film and a mask film over the silicon-containing film;

(b) supplying a processing gas to the chamber; and (c) forming a plasma from the processing gas to etch the silicon-containing film with an HF species included in the plasma, wherein the processing gas in (b) includes a tungsten-containing gas, a hydrogen fluoride gas, a phosphorus-containing gas, and at least one gas selected from the group consisting of carbon-containing gases, oxygen-containing gases, and halogen-containing gases other than fluorine, wherein a flow rate of the tungsten-containing gas is the lowest of gases included in the processing gas, and the flow rate of the tungsten-containing gas is 1% by volume or less relative to an overall flow rate of the processing gas, and wherein, in (c), the etching of the silicon-containing film is conducted while forming a protective film on the mask film by tungsten in the tungsten-contained gas.

15. The plasma processing method according to claim 14, wherein the HF species is produced from at least one gas selected from the group consisting of HF gases and hydro-fluorocarbon gases.

16. The plasma processing method according to claim 14, wherein the HF species is produced from a hydrofluorocarbon gas with two or more carbon atoms.

17. The plasma processing method according to claim 14, wherein the HF species is produced from at least one gas selected from the group consisting of $CH_2F_2$ gas, $C_3H_2F_4$ gas, $C_3H_2F_6$ gas, and $C_4H_2F_6$ gas.

* * * * *